United States Patent [19]

Kouwenhoven et al.

[11] Patent Number: 5,792,054

[45] Date of Patent: Aug. 11, 1998

[54] DEVICE AND METHOD FOR MAGNETIC RESONANCE IMAGING

[75] Inventors: Marc Kouwenhoven; Johannes J. Van Vaals; Lennart Hofland; Rudolf W. De Boer, all of Eindhoven, Netherlands

[73] Assignee: U.S. Philips Corporation, New York, N.Y.

[21] Appl. No.: 712,953

[22] Filed: Sep. 12, 1996

Related U.S. Application Data

[63] Continuation of Ser. No. 253,045, Jun. 2, 1994, abandoned.

[30] Foreign Application Priority Data

Jun. 2, 1993 [EP] European Pat. Off. ............ 93201585

[51] Int. Cl.[6] .................................................. A61B 5/055
[52] U.S. Cl. ............................ 600/410; 324/306; 600/419
[58] Field of Search .......................... 128/653.2, 653.3; 324/306, 309; 600/410, 419

[56] References Cited

U.S. PATENT DOCUMENTS

| | | | |
|---|---|---|---|
| 5,050,609 | 9/1991 | Balaban et al. | 128/653.4 |
| 5,250,898 | 10/1993 | Hu et al. | 324/309 |
| 5,270,652 | 12/1993 | Dixon et al. | 128/653.2 |
| 5,320,099 | 6/1994 | Roberts et al. | 128/653.3 |
| 5,339,035 | 8/1994 | Schneider et al. | 324/309 |
| 5,627,468 | 5/1997 | Kojima et al. | 324/307 |

FOREIGN PATENT DOCUMENTS 4032583  5/1991  Germany.

OTHER PUBLICATIONS

"Magnetization Transfer Time–of–Flight Magnetic Resonance Angiography", by G.B. Pike, et al, Magnetic Resonance in Medicine 25, 1992, pp. 372-379.

*Primary Examiner*—Brian Casler
*Attorney, Agent, or Firm*—Jack D. Slobod

[57] ABSTRACT

An off-resonance magnetization transfer contrast (MTC) RF-pulse (54, 64) is used in magnetic resonance angiography (MRA) to suppress the signal of various stationary tissues, such as brain tissue while avoiding significant suppression of signal from blood flowing in a general direction of blood flow into a slice being imaged. Application of a magnetic gradient (55, 65, 85) during the MTC RF-pulse (54, 64) directed in the general direction of blood flow increases the magnetization frequency offset (86) relative to the center frequency of the MTC RF-pulse for points within and feeding blood to the slice. The MTC RF-pulse thus causes only a small signal reduction of the blood flowing into the slice in the general direction of blood flow while producing a saturation of any blood flowing into the slice in the opposite direction. Consequently, both time and RF-power needed for a separate presaturation pulse can now be used for the MTC RF-pulse.

18 Claims, 2 Drawing Sheets

DEVICE AND METHOD FOR MAGNETIC RESONANCE IMAGING

This is a continuation of application Ser. No. 08/253,045 filed JUN. 2, 1994 abandon.

FIELD OF THE INVENTION.

The invention relates to a device and a method for magnetic resonance imaging. Especially, the invention relates to a device and a method in which use is made of the transfer of magnetisation between free and bound protons to enhance the contrast between different types of tissues and fluids in a body.

BACKGROUND OF THE INVENTION.

Such a method is known from Article "Magnetisation transfer time-of-flight magnetic resonance angiography", by G. B. Pike et al. in Magn. Reson. Med., Vol. 25, 372–379. In the method described the RF-excitation pulse is preceded by a magnetisation transfer contrast (MTC) RF-pulse. Such a method for contrast enhancement of blood has several problems. Firstly, as magnetisation transfer contrast (MTC) is based on the suppression of magnetic resonance signals whereby the rate of suppression varies for different types of tissues and blood, in general the magnetic signal from blood is reduced as well. Secondly, the MTC RF-pulse precedes the excitation RF-pulse by 10 to 15 milliseconds, the total repetition time of a data acquisition sequence is increased by this amount which results in a slower overall data acquisition. And thirdly, the MTC RF-pulse contributes to the total amount of RF energy deposited in the person or animal to be imaged. This limits the RF power that can be used in the MTC RF-pulse or that can be used in other pulses in the sequence.

SUMMARY OF THE INVENTION.

It is, inter alia, an object of the present invention to provide a device and a method for magnetic resonance imaging in which the signal of flowing blood is less reduced.

To achieve this object, a magnetic resonance device according to the invention comprises an area for locating an object to be imaged;

- a magnet system for generating a substantially homogeneous and stationary magnetic field in at least part of the area;
- a gradient magnet system comprising gradient coils for switching on and off magnetic field gradient pulses in the area, superimposed on said stationary magnetic field;
- a radio-frequency (RF) transmitter system for generating and transmitting RF-pulses to the object;
- control means for controlling the switching and size of the RF-pulses and magnetic field gradients such that by the combination of generated RF-pulses and magnetic field gradient pulses position dependent magnetic resonance signals are generated in the object;
- a detector and reconstruction system for acquisition of position dependent magnetic resonance signals generated in the object and for image-construction, the image representing the internal structure of the object;
- the control means being arranged for generating an excitation RF-pulse at an excitation frequency for a part of the object, said part being selected by a magnetic field gradient pulse switched on during the excitation RF-pulse; and
- for generating a magnetisation transfer contrast RF-pulse (MTC RF-pulse) prior to the excitation RF-pulse;
- wherein the control means is further arranged for switching a gradient magnetic field pulse during the MTC RF-pulse.

The method according to the invention for magnetic resonance imaging of an object in a substantially homogeneous and stationary magnetic field, comprises

- application of radio-frequency (RF) pulses to the object and switching on and off magnetic field gradient pulses superimposed on said stationary magnetic field such that position dependent magnetic resonance signals are generated in the object;
- acquisition of position dependent magnetic resonance signals generated in the object and subsequent reconstruction of an image, the image representing the internal structure of the object; wherein
- an excitation RF-pulse is generated at an excitation frequency for a part of the object, said part being selected by switching on a magnetic field gradient pulse during the excitation RF-pulse; and
- a magnetisation transfer contrast RF-pulse (MTC RF-pulse) is generated prior to the excitation RF-pulse;
- which MTC RF-pulse coincides with a gradient magnetic field pulse.

The gradient magnetic field which is switched on during the MTC RF-pulse creates a spatially varying off-resonance frequency (SVORF) or, to be more accurately, the MTC RF-pulse is given a spatially varying offset relative to the resonance frequency in the volume to be imaged. Since the MTC effect is roughly inversely proportional to the resonance frequency offset the reduction of blood magnetisation will decrease locally, without affecting the MTC signal of static tissue. By a proper choice of the frequency of the MTC RF-pulse and the gradient magnetic field, the net effect will be that blood entering the imaging volume, i.e. the portion of the object in which the Larmor frequency equals the RF-frequency of the excitation pulse, will have more longitudinal magnetisation, hence will give more signal in the imaging volume.

For these reasons, in a preferred embodiment of the invention the MTC RF-pulse has a frequency that deviates from the frequency of the excitation RF-pulse.

The gradient strength should be chosen as large as possible but with the condition that, within the imaging volume, the MTC frequency does not come too close to the (local) Larmor frequency.

A specific embodiment of the invention can be used for imaging a portion of a body of a living human or animal. In this embodiment the gradient magnetic field pulse switched on during the MTC RF-pulse is such that the total magnetic field strength increases in the direction in the general direction of flow of blood to be imaged. The main application foreseen is for imaging the head, but other parts of the body are possible as well. At one side of the imaging volume the MTC RF pulse will be on-resonance, saturating the blood flowing into the imaging volume from that one side. In the opposite direction, the MTC RF-pulse will be strongly off-resonance and the signal from blood flowing into the imaging volume from this direction will be hardly suppressed by the MTC effect.

Preferably, in accordance to the invention, the portion of the body with a Larmor frequency equal to the frequency of the MTC RF-pulse is located in the direction of outflow of arterial blood, relative to the portion of the body in which the Larmor frequency is equal to the frequency of the excitation RF-pulse. In this way, the arterial blood signal is relatively enhanced while the venous blood signal is saturated and, consequently, suppressed. As the venous blood signal usually is suppressed anyway by means of a presaturation pulse sequence, a separate presaturation RF-pulse is not necessary with the present invention. So, the time needed for presaturation is not additional to the repetition time between subsequent sequences. In addition, also the RF power dissipation in the object or body caused by presaturation does not occur and the power of the MTC RF-pulse can be increased without violating the imposed limits on the specific absorption rate (SAR).

These and other, more detailed, aspects of the invention will now be described and illustrated with reference to the Figures.

DESCRIPTION OF (PREFERRED) EMBODIMENT(S).

Figure 1:
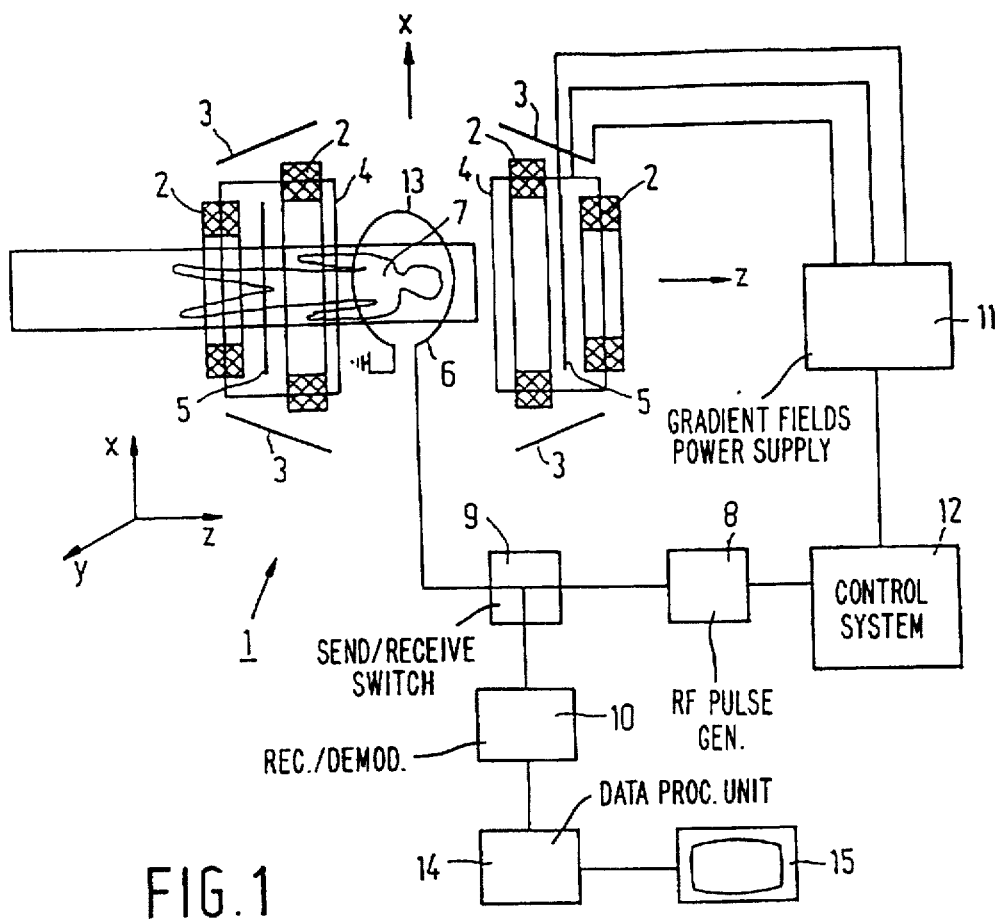
FIG. 1 shows diagrammatically a magnetic resonance imaging device, suitable for use of the invention.

In FIG. 1 a magnetic resonance apparatus 1 is diagrammatically shown. The apparatus comprises a set of main magnetic coils 2 for generating a stationary and homogeneous main magnetic field and several sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energised via a power supply 11. The apparatus further comprises an emitting means including an RF coil 6 for emitting radio-frequency pulses (RF-pulses) to an object or body 7, the RF coil being coupled to an RF pulse generator 8 for generating RF-pulses. Also provided are means for receiving the magnetic resonance signals, these means can use the same RF coil 6 or separate one. If the same RF coil is used for emitting and receiving, as shown in the FIG. 1, a send-receive switch 9 is arranged to separate the received signals from the pulses to be emitted. The received magnetic resonance signals are input to receiver/demodulator 10. The emitting means 6 and 8 and the power supply 11 for the gradient coils 3, 4 and 5 are steered by a control system 12 to generate a predetermined sequence of RF-pulses and gradient field pulses or waveforms. The receiver/demodulator is coupled to a data processing unit 14, for example a computer, for transformation of the received signals into an image that can be made visible, for example on a visual display unit 15.

If the magnetic resonance apparatus 1 is put into operation with an object or body 7 placed in the magnetic field, a small excess of nuclear dipole moments (nuclear spins) in the body will be aligned in the direction of the magnetic field. In equilibrium, this causes a net magnetisation $M_0$ in the material of the body 7, directed in parallel with the magnetic field. In the apparatus 1 the macroscopic magnetisation $M_0$ is manipulated by radiating to the body RF-pulses having a frequency equal to the Larmor frequency of the nuclei, thereby bringing the nuclear dipole moments in an excited state and re-orienting the magnetisation $M_0$. By applying the proper RF-pulses, a rotation of the macroscopic magnetisation is obtained, the angle of rotation is called the flip-angle. The intentional introduction of variations in the magnetic field by applying gradient magnetic fields influences the behaviour of the magnetisation locally. After the application of RF-pulses, the changed magnetisation will strive to return to a state of thermal equilibrium in the magnetic field, emitting radiation in the process. A well chosen sequence of RF-pulses and gradient field pulses causes this radiation to be emitted as magnetic resonance signals which provide information about the density of a certain type of nuclei, for example hydrogen nuclei, and the substance in which they occur. By analysis of the emitted signals and presentation of it in the form of images, information about the internal structure of the object or body 7 is accessible. For a more detailed descriptions of magnetic resonance imaging (MRI) and MRI-devices reference is made to the extensive literature on this subject, for example to the book "Practical NMR Imaging", edited by M. A. Foster and J. M. S. Hutchison, 1987, IRL Press.

Figure 2:
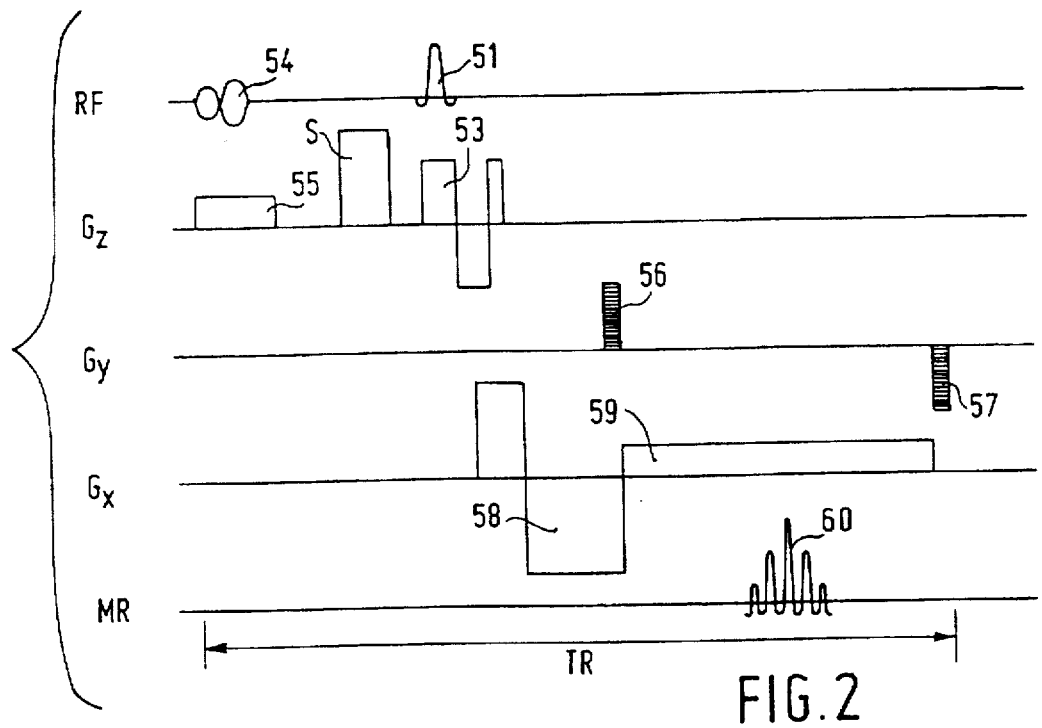
FIG. 2 shows a RF- and magnetic gradient pulse sequence according to the invention.

In FIG. 2 a first example of an RF- and gradient pulse sequence is shown in accordance to the invention. In this figure, as in FIG. 3, time proceeds from left to right and the various rows indicate diagrammatically the time relation between RF-pulses, magnetic field gradient pulses and magnetic resonance signals. In the upper row RF the radio-frequency pulses are shown, in the following three rows, labelled $G_z$, $G_y$ and $G_x$, the switching of gradient magnetic field pulses in three orthogonal directions is indicated and in the fifth row, MR, the occurrence of a magnetic resonance signal. By means of an RF-pulse 51, the magnetisation due the stationary magnetic field is rotated and a transverse component of the magnetisation is obtained. A slice selection magnetic field gradient pulse 53 limits the effect of the RF-pulse to a volume or slice in the object in which the Larmor frequency is equal to the frequency of the RF-pulse 51, only this volume or slice is excited by the RF-pulse 51, magnetisation outside this volume or slice is not rotated. The time-integrated strength of the RF-pulse 51 may be such that rotation occurs over 90° or substantially less, i.e. down to only a few degrees. In known manner, the slice selection magnetic field gradient pulse 53 comprises a portion with opposite polarity, to compensate for the dephasing nuclear spins experience during the application of the first portion of the slice selection gradient. The slice selection magnetic field gradient pulse 53 may be followed by a bipolar gradient to suppress the effect on the phase of moving matter, c.q. blood, due to the slice selection pulse and its phase compensating portion. After the RF-pulse 51, a dephasing magnetic field gradient pulse 58 is applied in one direction within the excited slice. Shortly afterwards a so-called read magnetic field gradient 59 is applied, in the same direction but with opposite polarity as compared to the magnetic field gradient pulse 58 is reversed, thereby rephasing the nuclear spins and generating a magnetic resonance signal 60. As the presence of the read gradient 59 means that the total magnetic field strength varies in one direction within the excited slice, the frequency of the magnetic resonance signal varies in that direction. In the perpendicular direction a phase encoding magnetic field gradient pulse 56 is applied in between the excitation RF-pulse 51 and the read gradient 59 to establish a variation in the phase of the magnetic resonance signal in this direction. As with the slice selection gradient, the bipolar pair consisting of the dephasing and read gradients 58 and 59 generate a phase error in moving matter. This phase error may be removed by a bipolar gradient applied before this pair.

The effects of the phase-encoding magnetic field gradient pulse 56 can be compensated by a compensating magnetic field gradient pulse 57 after acquisition of the magnetic resonance signal. This allows a renewed excitation without phase encoding left from the last excitation. Acquisition of data at a plurality of phase encoding values accumulates a set of data from which the spin density distribution in the selected slice can be determined. Normally a spin density distribution is presented in the form of an image of the slice.

Figure 3:
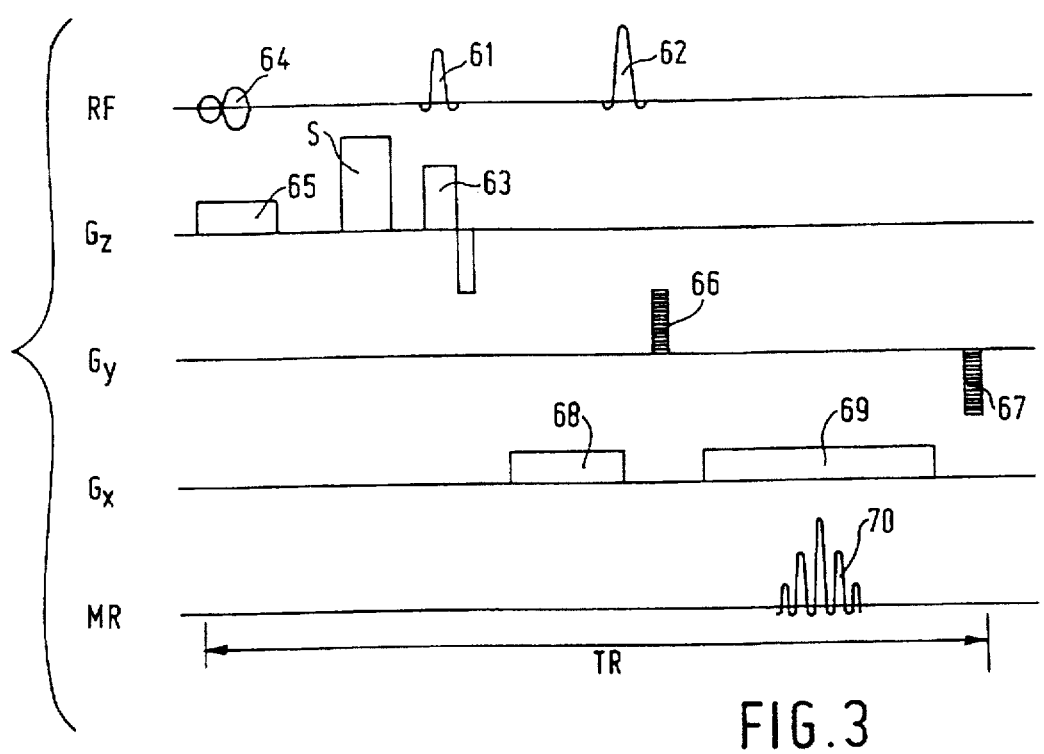
FIG. 3 shows another RF- and magnetic gradient pulse sequence according to the invention.

In FIG. 3 a different technique of obtaining magnetic resonance signals is illustrated. An excitation RF-pulse 61 rotates the magnetisation is a slice, selected by means of a gradient magnetic field pulse 63. A second RF-pulse 62 reverses the rotated nuclear spins and a magnetic resonance signal 70 is generated at a time TE after the excitation RF-pulse 61 which time TE is twice the time interval in between the two RF-pulses 61 and 62. As in the first example, shown in FIG. 2, the magnetic resonance signal is frequency and phase encoded in two perpendicular directions in the selected slice by means of a read magnetic field gradient 69 and a phase encoding magnetic field gradient pulse 66. The read magnetic field gradient 69 is preceded by a dephasing gradient magnetic pulse 68, this dephasing gradient pulse 68 has the same polarity as the read gradient 69 because the second RF-pulse 62 reverses the magnetisation. A phase-encoding compensation gradient magnetic field pulse 67 can be applied to remove the phase difference between the nuclear spins imposed by the magnetic field gradient pulse 66. Bipolar magnetic gradient pulses (not shown) may be applied to suppress the phase errors that can be experienced by moving matter.

Normally the object investigated by magnetic resonance imaging is a living patient. In that case, different types of tissue and blood are present in the slice, for example white and grey brain matter and blood, the matter comprises free protons in water and bound protons, for example in lipid. Between the free and bound protons transfer of magnetisation occurs, this effect is used to enhance the contrast between different types of tissue and blood. As described in the article by G. B. Pike et al., mentioned hereinbefore, a magnetic transfer contrast RF-pulse (MTC RF-pulse) prior to the excitation RF-pulse, reduces the signal for all tissues but with different ratios, resulting in enhanced contrast. Investigations to this effect for magnetic resonance angiography (MRA) in the head has shown that the signal for static brain tissue can be suppressed by up to about 40%. Non-flowing blood experiences a signal reduction of about 20% and for flowing blood the signal reduction is from 0 to 20% So, the gain of contrast of blood with MTC is between 20% and 40%.

According to the present invention an MTC RF-pulse 54 or 64 is applied simultaneously with a gradient magnetic field pulse, the MTC gradient pulse 55 or 65, of which the gradient is in the same, or opposite, direction as the gradient of the slice selection gradient magnetic field pulse 53 or 63, respectively. The magnetic field gradient pulse 55, 65 and the frequency of the MTC RF-pulse 55, 65 is normally chosen such that the MTC RF-pulse is off-frequency by 0.5 to 4 kHz at the imaging volume, i.e. the volume or slice selected by combination of the excitation RF-pulse 51, 61 and the slice selection magnetic field gradient pulse 53, 63. The effect of the MTC RF-pulse 54, 64 in combination with the MTC gradient pulse 55, 65 will be illustrated, by way of example, with reference to FIG. 4. In between the MTC RF-pulse 54, 64 and the excitation RF-pulse 51, 61 a spoiler magnetic field gradient pulse S can be applied to destroy any transverse magnetisation due to the MTC RF-pulse. The effect of the spoiler gradient S is that of a strong dephasing gradient.

Figure 4:
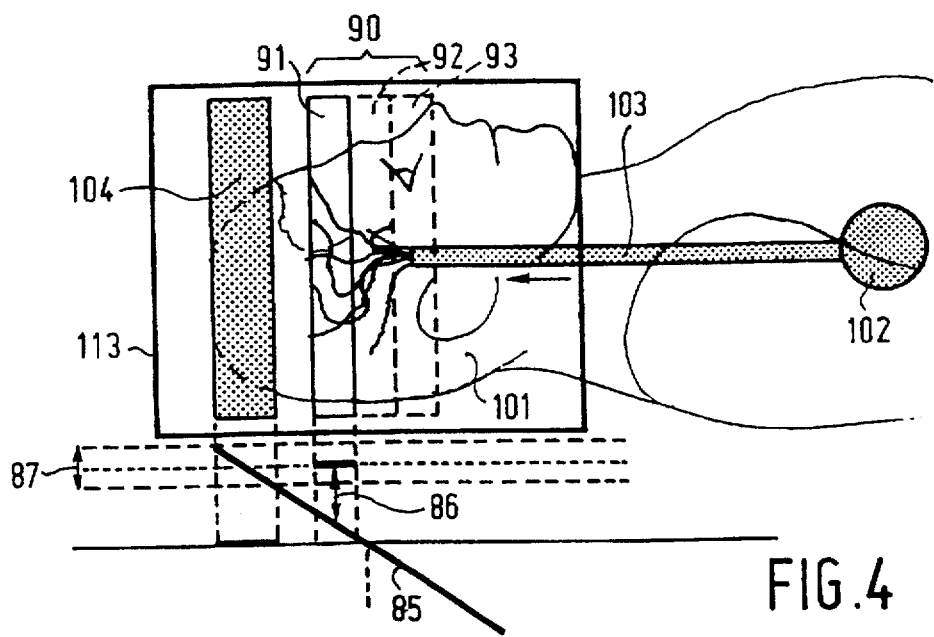
FIG. 4 illustrates the application of the invention in imaging a head.

FIG. 4 shows, diagrammatically, a human head 101 into which arterial blood flows from the heart 102 via the carotids 103. An imaging volume 90, divided in a series of slices 91, 92, 93, ... is to be imaged using an RF-coil 113, as described hereinbefore, the slices are selected by means of a magnetic field gradient pulse applied simultaneously with an excitation RF-pulse. In this example, the MTC gradient is applied such that the total magnetic field (stationary plus gradient field), as indicated by line 85 in the lower half of the Figure, increases in strength in the cranial direction and the frequency of the MTC RF-pulse is larger than the Larmor frequency in the slices to be imaged. In the imaging volume 90, the MTC RF-pulse frequency is off-resonance by an amount equal to the magnetic field difference indicated by reference numeral 86 the gyromagnetic. The MTC RF-pulse frequency is now on-resonance somewhere in cranial direction of the imaging volume 90. In this on-resonance volume 104 blood is saturated and, consequently, in the imaging volume 90 the venous blood coming from this on-resonance volume 104 is suppressed. Normally, suppression of venous blood is desirable and separate presaturation RF-pulses are applied to this effect. As such presaturation RF-pulses can be skipped in the present sequence, the repetition time TR of a sequence containing both is reduced, relative to a sequence MTC and presaturation pulses. Also, the RF-power of the presaturation pulse can be, partially, used in the MTC RF-pulse, the power of which can be increased without increasing the total SAR.

The arterial blood, entering the imaging volume from the caudal direction, will have experienced MTC RF-pulses with a larger offset, so that the reduction in longitudinal magnetisation, due to the MTC effect, will be less, as compared to the situation without an MTC gradient. The maximum MTC gradient strength 85 that can be used depends only on the three-dimensional imaging slice thickness and on the MTC RF bandwidth corresponding to the magnetic field difference, indicated by reference numeral 87 times the gyromagnetic constant. Using a multi-slice technique, in which the total imaging volume 90 is split in several thinner slices in each of which three-dimensional images are obtained, the MTC gradient strength can be chosen higher as compared to a technique in which a three-dimensional image is obtained for the whole volume 90. As the off-resonance frequency with use of the MTC gradient is a function of the off-centre distance of the imaged slice, the multi-slice technique is more effective.

Application of the MTC gradient did show a marked improvement in small vessel contrast as compared to a similar measurement without the MTC gradient. It also appeared that the presaturation of venous blood by the combination of the MTC RF-pulse and the MTC gradient is quite effective.

By reversal of the MTC gradient the arterial blood can be suppressed by presaturation and the venous blood signal relatively enhanced. The technique can also be applied to other parts of the body, for example a hand or a foot.

We claim:

1. Magnetic resonance imaging (MRI) device, comprising an area for locating at least a portion of an object which is a living human or animal containing a part to be imaged;

a magnet system for generating a substantially homogeneous and stationary magnetic field in at least part of the area;

a gradient magnet system comprising gradient coils for switching on and off magnetic field gradient pulses superimposed on said stationary magnetic field in order to form instantaneous total magnetic fields at points in the area;

a radio-frequency (RF) transmitter system for generating and transmitting RF-pulses to the object;

control means for controlling the radio frequency transmitter system and the switching on and off and sizes of the magnetic field gradient pulses such that by the combination of generated RF-pulses and magnetic field gradient pulses position dependent magnetic resonance signals are generated in the object;

a detector and reconstruction system for acquisition of position dependent magnetic resonance signals generated in the object and for image-construction, the image representing flowing blood of a type, selected from arterial blood and venous blood, within the internal structure of the part to be imaged;

wherein the control means comprises means for controlling generation of an excitation RF-pulse by the transmitter system at an excitation frequency for the part of the object to be imaged, switching of a magnetic field gradient pulse to be on during the excitation RF-pulse for selection of said part, for controlling generation of a magnetization transfer contrast (MTC) RF-pulse prior to the excitation RF-pulse and for controlling switching of a magnetic field gradient pulse to be on during the MTC RF-pulse for producing an intended MTC effect of suppressing MR signals from static tissue within said part to be imaged, the magnetic field gradient pulse switched to be on during the MTC RF-pulse and the frequency of the MTC RF-pulse being chosen such that a part of the object with a Larmor frequency equal to the frequency of the MTC RF-pulse is located in the direction of flow of the selected type of blood relative to the part of the object selected by the magnetic field gradient pulse switched to be on during the excitation RF-pulse in order to produce an effect on blood of the type not selected flowing into the part to be imaged which is greater than any effect on the selected type of blood flowing into the part to be imaged.

2. MRI device as claimed in claim 1, wherein the MTC RF-pulse generated is of a frequency that deviates from the frequency of the excitation RF-pulse.

3. MRI device as claimed in claim 2, wherein the magnetic field gradient pulse switched to be on during the MTC RF-pulse is directed such that the instantaneous total magnetic field at said points within the area increases in the general direction of flow of the selected type of blood.

4. MRI device as claimed in claim 3, wherein the selected type of blood is arterial blood.

5. MRI device as claimed in claim 4, wherein the control means and detector and reconstruction means are configured for acquisition of magnetic resonance signals in a three-dimensional volume by subsequent data acquisition for each of a plurality of slices in the three-dimensional volume, and wherein the magnetic field gradient pulse switched to be on during the MTC RF-pulse is adapted to each of the slices.

6. MRI device as claimed in claim 3, wherein the control means and detector and reconstruction means are configured for acquisition of magnetic resonance signals in a three-dimensional volume by subsequent data acquisition for each of a plurality of slices in the three-dimensional volume, and wherein the magnetic field gradient pulse switched to be on during the MTC RF-pulse is adapted to each of the slices.

7. MRI device as claimed in claim 2, wherein the control means and detector and reconstruction means are configured for acquisition of magnetic resonance signals in a three-dimensional volume by subsequent data acquisition for each of a plurality of slices in the three-dimensional volume, and wherein the magnetic field gradient pulse switched to be on during the MTC RF-pulse is adapted to each of the slices.

8. MRI device as claimed in claim 1, suitable for imaging an object that is a portion of a body of a living human or animal in which blood is flowing, wherein the magnetic field gradient pulse switched to be on during the MTC RF-pulse is directed such that the instantaneous total magnetic field at said points within the area increases in the general direction of flow of the selected type of blood.

9. MRI device as claimed in claim 8, wherein the selected type of blood is arterial blood.

10. MRI device as claimed in claim 9, wherein the control means and detector and reconstruction means are configured for acquisition of magnetic resonance signals in a three-dimensional volume by subsequent data acquisition for each of a plurality of slices in the three-dimensional volume, and wherein the magnetic field gradient pulse switched to be on during the MTC RF-pulse is adapted to each of the slices.

11. MRI device as claimed in claim 8, wherein the control means and detector and reconstruction means are configured for acquisition of magnetic resonance signals in a three-dimensional volume by subsequent data acquisition for each of a plurality of slices in the three-dimensional volume, and wherein the magnetic field gradient pulse switched to be on during the MTC RF-pulse is adapted to each of the slices.

12. MRI device as claimed in claim 1, wherein the control means and detector and reconstruction means are configured for acquisition of magnetic resonance signals in a three-dimensional volume by subsequent data acquisition for each of a plurality of slices in the three-dimensional volume, and wherein the magnetic field gradient pulse switched to be on during the MTC RF-pulse is adapted to each of the slices.

13. Method for magnetic resonance imaging of an object in a substantially homogeneous and stationary magnetic field, comprising:

applying radio-frequency (RF) pulses to the object and switching on and off magnetic field gradient pulses superimposed on said stationary magnetic field to produce instantaneous total magnetic fields at points in the object such that position dependent magnetic resonance signals are generated in the object; and acquiring position dependent magnetic resonance signals generated in the object and subsequently reconstructing an image representing flowing blood of a type, selected from arterial blood and venous blood, within the internal structure of a part of the object to be imaged;

wherein said radio-frequency pulses and said magnetic field gradient pulses include an excitation RF-pulse which is generated at an excitation frequency for a part of the object, said part being selected by switching a magnetic field gradient pulse to be on during the excitation RF-pulse, and a magnetization transfer contrast (MTC) RF-pulse which is generated prior to the excitation RF-pulse and during a magnetic field gradient pulse for producing an intended MTC effect of suppressing MR signals from static tissue within said part to be imaged, the magnetic field gradient pulse switched to be on during the MTC RF-pulse and the frequency of the MTC RF-pulse being chosen such that a part of the object with a Larmor frequency equal to the frequency of the MTC RF-pulse is located in the direction of flow of the selected type of blood relative to the part of the object selected by the magnetic field gradient pulse switched to be on during the excitation RF-pulse in order to produce an effect on blood of the type not selected flowing into the part to be imaged which is greater than any effect on the selected type of blood flowing into the part to be imaged.

14. Method as claimed in claim 13, wherein the MTC RF-pulse has a frequency that deviates from the frequency of the excitation RF-pulse.

15. Method as claimed in claim 14, wherein the control means is arranged for establishing a magnetic field gradient pulse during the MTC RF-pulse by which the total magnetic field strength increases in the general direction of flow of the selected type of blood.

16. Method as claimed in claim 15, wherein the selected type of blood is arterial blood.

17. Method as claimed in claim 13, wherein the magnetic field gradient pulse switched to be on during the MTC RF-pulse is directed such that the instantaneous total magnetic field increases in the general direction of flow of the selected type of blood.

18. Method for magnetic resonance imaging of an object in a substantially homogeneous and stationary magnetic field, which object is a portion of a body of a living human or animal in which there is blood flowing in a general direction to be imaged and blood flow reverses in direction from the general direction of blood flow, said method comprising:

applying radio-frequency (RF) pulses to the object and switching on and off magnetic field gradient pulses superimposed on said stationary magnetic field to produce instantaneous total magnetic fields at points in the object such that position dependent magnetic resonance signals are generated in the object, and acquiring position dependent magnetic resonance signals generated in the object and subsequently reconstructing an image representing the internal structure of the object;

wherein said radio-frequency pulses and said magnetic field gradient pulses include an excitation RF-pulse which is generated at an excitation frequency for a part of the object, said part being selected by switching a magnetic field gradient pulse to be on during the excitation RF-pulse, and a magnetization transfer contrast (MTC) RF-pulse for producing a MTC effect which MTC RF-pulse is generated to the excitation RF-pulse and during a magnetic field gradient pulse, and wherein the magnetic field gradient pulse switched to be on during the MTC RF-pulse is directed such that the instantaneous total magnetic field increases in the general direction of blood flow to be imaged, and the magnetic field gradient pulse switched to be on during the MTC RF-pulse is applied such that a portion of the body having a Larmor frequency equal to the frequency of the MTC RF-pulse is located in the direction of flow of arterial blood, relative to the portion of the body selected by the magnetic field gradient pulse switched to be on during the excitation RF-pulse.

* * * * *